(12) United States Patent
Choi et al.

(10) Patent No.: US 8,030,106 B2
(45) Date of Patent: Oct. 4, 2011

(54) DISPLAY DEVICE AND METHOD OF MANUFACTURING THE SAME

(75) Inventors: Hee-Dong Choi, Seosan-si (KR); Seong-Moh Seo, Suwon-si (KR)

(73) Assignee: LG. Display Co. Ltd., Seoul (KR)

( * ) Notice: Subject to any disclaimer, the term of this patent is extended or adjusted under 35 U.S.C. 154(b) by 74 days.

(21) Appl. No.: 12/497,101

(22) Filed: Jul. 2, 2009

(65) Prior Publication Data

US 2010/0123138 A1 May 20, 2010

(30) Foreign Application Priority Data

Nov. 20, 2008 (KR) .................. 10-2008-0115551

(51) Int. Cl.
*H01L 21/84* (2006.01)
(52) U.S. Cl. .............. 438/30; 438/158; 257/E21.561
(58) Field of Classification Search .......... 438/151–166, 438/30; 257/E21.561
See application file for complete search history.

(56) References Cited

U.S. PATENT DOCUMENTS

| 4,601,097 | A | * | 7/1986 | Shimbo | 438/159 |
| 4,619,034 | A | * | 10/1986 | Janning | 438/158 |
| 5,466,620 | A | * | 11/1995 | Bang | 438/30 |
| 5,478,766 | A | * | 12/1995 | Park et al. | 438/158 |
| 5,573,958 | A | * | 11/1996 | Fukui et al. | 438/158 |
| 6,133,075 | A | * | 10/2000 | Yamazaki et al. | 438/158 |
| 2007/0292996 | A1 | * | 12/2007 | Abadeer et al. | 438/165 |

* cited by examiner

*Primary Examiner* — Richard A. Booth
(74) *Attorney, Agent, or Firm* — Brinks Hofer Gilson & Lione

(57) ABSTRACT

A method of manufacturing a display device includes forming a gate electrode on a substrate, a gate insulating layer on the gate electrode, and an active layer on the gate insulating layer, the gate electrode made of extrinsic polycrystalline silicon, the active layer made of intrinsic polycrystalline silicon; forming an etch stopper on the active layer; forming source and drain electrodes spaced apart from each other on the etch stopper; forming an ohmic contact layer each between a side of the active layer and the source electrode and between an opposing side of the active layer and the drain electrode; forming a gate line connected to the gate electrode; and forming a data line crossing the gate line.

13 Claims, 7 Drawing Sheets

SPC

DISPLAY DEVICE AND METHOD OF MANUFACTURING THE SAME

RELATED APPLICATIONS

The present invention claims the benefit of Korean Patent Application No. 10-2008-0115551, filed in Korea on Nov. 20, 2008, which is hereby incorporated by reference for all purposes as if fully set forth herein.

BACKGROUND

1. Field of the Disclosure

The present disclosure relates to a display device, and more particularly, to a display device and a method of manufacturing the same.

2. Discussion of the Related Art

Until recently, display devices have typically used cathode-ray tubes (CRTs). Presently, many efforts and studies are being made to develop various types of flat panel displays, such as liquid crystal display (LCD) devices, plasma display panel (PDP) devices, field emission displays, organic electroluminescence display (OELD) devices and the like, as a substitute for CRTs. Recently, active matrix type LCD devices, PDP devices, OELD devices and the like have been widely used. The active matrix type display devices include a TFT substrate, which is referred to as an array substrate, and the array substrate includes a plurality of thin film transistors formed in a plurality of pixels, respectively.

FIG. 1 is a cross-sectional view illustrating an array substrate for a display device according to the related art. For example, FIG. 1 shows an array substrate of an LCD device among display devices.

Referring to FIG. 1, the array substrate includes a gate line and a data line 33 crossing each other on a substrate 11 to define a pixel region P. A thin film transistor Tr is connected to the gate line and the data line 33. The thin film transistor Tr is formed in a switching region TrA. The thin film transistor Tr includes a gate electrode 15, a semiconductor layer 28, and source and drain electrodes 36 and 38. The semiconductor layer 28 includes an active layer 22 made of intrinsic amorphous silicon and both ohmic contact layers 26 made of extrinsic amorphous silicon. A gate insulating layer 18 is formed on the gate line and the gate electrode 15. A passivation layer 42 is formed on the thin film transistor Tr and includes a drain contact hole 45 exposing the drain electrode 38. A pixel electrode 50 is formed on the passivation layer 42 and contacts the drain electrode 38 through the drain contact hole 45.

A semiconductor pattern 29 is formed below the data line 33. The semiconductor pattern 29 includes a first pattern 23 made of intrinsic amorphous silicon and a second pattern 27 made of extrinsic amorphous silicon.

In the related art array substrate, a portion of the active layer 22 below the ohmic contact layers 26 has a thickness t2 more than a thickness t1 of a portion of the active layer 22 between the ohmic contact layers 26. This thickness difference is caused by a manufacturing process, and due to the thickness difference, a property of the thin film transistor Tr is degraded.

FIGS. 2A to 2E are cross-sectional views illustrating forming the thin film transistor of FIG. 1. For convenience' sake, FIGS. 2A to 2E does not show the gate electrode and the gate insulating layer.

Referring to FIG. 2A, an intrinsic amorphous silicon layer 20, an extrinsic amorphous silicon layer 24 and a metal layer 30 are formed on a substrate 11. Then, a photoresist pattern is formed on the metal layer 30. The photoresist pattern includes first portions 91 and a second portion 92, and the first portions 91 are at both sides of the second portion 92. The first portions 91 have a thickness more than the second portion 92.

Referring to FIG. 2B, the metal layer (30 of FIG. 2A), the extrinsic amorphous silicon layer (24 of FIG. 2A) and the intrinsic amorphous silicon layer (20 of FIG. 2A) are etched using the photoresist pattern to form a source-drain pattern 31, an extrinsic amorphous silicon pattern 25 and an active layer 22.

Referring to FIG. 2C, an ashing process is performed to remove the second portion (92 of FIG. 2B). The first portions 91 are partially removed and the thickness of the first portions 91 decreases.

Referring to FIG. 2D, the source-drain pattern (31 of FIG. 2C) is etched using the ashed photoresist pattern to form source and drain electrodes 36 and 38 spaced apart from each other.

Referring to FIG. 2E, a portion of the extrinsic amorphous silicon pattern (25 of FIG. 2D) between the source and drain electrodes 36 and 38 is dry-etched to form ohmic contact layers 26 below the source and drain electrodes 36 and 38, respectively. The dry-etching process continues enough to completely remove the portion of the extrinsic amorphous silicon pattern between the source and drain electrodes 36 and 38, and thus, a portion of the active layer 22 between the source and drain electrodes 36 and 38 is etched to a predetermined extent. Accordingly, the portion of the active layer 22 between the source and drain electrodes 36 and 38 has a thickness t1 less than a thickness t2 of a portion of the active layer 22 below the ohmic contact layers 26. If the dry-etching process is not performed enough, the extrinsic amorphous silicon pattern might remain on the portion of the active layer 22 between the source and drain electrodes 36 and 38. To prevent this, the dry-etching process continues to be performed until the active layer 22 is partially removed.

However, such a dry-etching process causes the active layer 22 not to be uniform. Further, the portion of the active layer 22 between the source and drain electrodes 36 and 38 to be damaged by the dry-etching. Accordingly, a property of the thin film transistor is degraded.

Further, since the active layer 22 is made of amorphous silicon, an electric property of the thin film transistor is not excellent. For example, a mobility of the active layer 22 is as low as about $0.1\,cm^2/V\cdot s$ to $1.0\,cm^2/V\cdot s$. Accordingly, there is a limit in employing the amorphous silicon active layer 22 into a thin film transistor for a driving circuit.

A polycrystalline silicon type thin film transistor has been proposed, which is manufactured by crystallizing an amorphous silicon layer using a laser apparatus. FIG. 3 is a cross-sectional view illustrating an array substrate, including a polycrystalline silicon type thin film transistor, for a display device according to the related art.

Referring to FIG. 3, an active layer 55 on a substrate 51 is made of polycrystalline silicon and includes an active portion 55a, and source and drain portions 55b and 55c at both sides of the active portion 55a. The source and drain portions 55b and 55c are doped with n+ or p+ ions. To dope the source and drain portions 55b and 55c, an ion implantation apparatus is additionally required. This causes production costs and processes to increase. Further, since the ion implantation apparatus is newly added, manufacturing apparatuses and processes for the array substrate should be newly configured.

SUMMARY

A method of manufacturing a display device includes forming a gate electrode on a substrate, a gate insulating layer on the gate electrode, and an active layer on the gate insulating layer, the gate electrode made of extrinsic polycrystalline silicon, the active layer made of intrinsic polycrystalline silicon; forming an etch stopper on the active layer; forming source and drain electrodes spaced apart from each other on the etch stopper; forming an ohmic contact layer each between a side of the active layer and the source electrode and between an opposing side of the active layer and the drain electrode; forming a gate line connected to the gate electrode; and forming a data line crossing the gate line.

In another aspect, a display device includes a gate electrode on a substrate, a gate insulating layer on the gate electrode, and an active layer on the gate insulating layer, the gate electrode made of extrinsic polycrystalline silicon, the active layer made of intrinsic polycrystalline silicon; an etch stopper on the active layer; source and drain electrodes spaced apart from each other on the etch stopper; an ohmic contact layer each between a side of the active layer and the source electrode and between an opposing side of the active layer and the drain electrode; a gate line connected to the gate electrode; and a data line crossing the gate line.

In another aspect, a method of manufacturing an electronic device includes forming a gate electrode on a substrate, a gate insulating layer on the gate electrode, and an active layer on the gate insulating layer, the gate electrode made of extrinsic polycrystalline silicon, the active layer made of intrinsic polycrystalline silicon; forming an etch stopper on the active layer; forming source and drain electrodes spaced apart from each other on the etch stopper; and forming an ohmic contact layer each between a side of the active layer and the source electrode and between an opposing side of the active layer and the drain electrode.

In another aspect, an electronic device includes a gate electrode on a substrate, a gate insulating layer on the gate electrode, and an active layer on the gate insulating layer, the gate electrode made of extrinsic polycrystalline silicon, the active layer made of intrinsic polycrystalline silicon; an etch stopper on the active layer; source and drain electrodes spaced apart from each other on the etch stopper; and an ohmic contact layer each between a side of the active layer and the source electrode and between an opposing side of the active layer and the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to illustrated embodiments of the present invention, which are illustrated in the accompanying drawings.

FIGS. 4A to 4L are cross-sectional views illustrating a method of manufacturing an array substrate for a display device according to an embodiment of the present invention. In FIGS. 4A to 4L, for example, an array substrate for an LCD device is described.

Figure 4A:
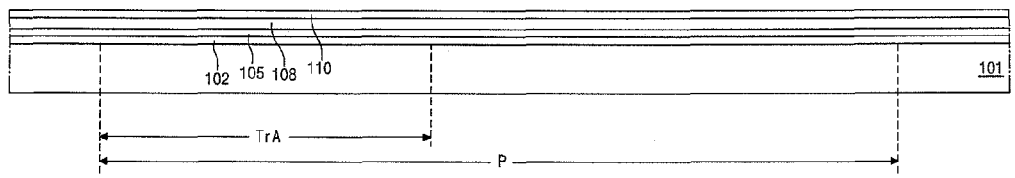
FIGS. 4A to 4L are cross-sectional views illustrating a method of manufacturing an array substrate for a display device according to an embodiment.

Referring to FIG. 4A, the array substrate according to the embodiment of the present invention includes a pixel region P and a switching region TrA. The switching region TrA may be in the pixel region P. The pixel region P is in a display region for displaying images.

A buffer layer 102 may be formed on the substrate 101. The buffer layer 102 may be made of an inorganic insulating material, for example, silicon oxide ($SiO_2$) and silicon nitride (SiNx). It is preferred that the buffer layer 102 is made of silicon oxide ($SiO_2$). The buffer layer 102 may have a thickness of about 2000 Å to about 3000 Å.

Then, an extrinsic amorphous silicon layer 105, a first insulating layer 108 and an intrinsic amorphous silicon layer 110 are formed on the buffer layer 102. The first insulating layer 108 may be made of an inorganic insulating material, for example, silicon oxide ($SiO_2$) and silicon nitride (SiNx). It is preferred that the first insulating layer 108 is made of silicon oxide ($SiO_2$). The extrinsic amorphous silicon layer 105 may have a thickness of about 500 Å to about 1000 Å. The extrinsic amorphous silicon layer 105 is doped with n+ ions or p+ ions.

The extrinsic amorphous silicon layer 105, the first insulating layer 108 and the intrinsic amorphous silicon layer 110 may be formed using a CVD (Chemical Vapor Deposition). For example, these layers 105, 108 and 110 are sequentially formed by changing reaction gases in the same CVD apparatus. This can simplify forming the layers 105, 108 and 110. Further, the buffer layer 102 may be formed using the CVD. Accordingly, the four layers 102, 105, 108 and 110 can be simply formed in the same CVD apparatus.

Figure 2A:
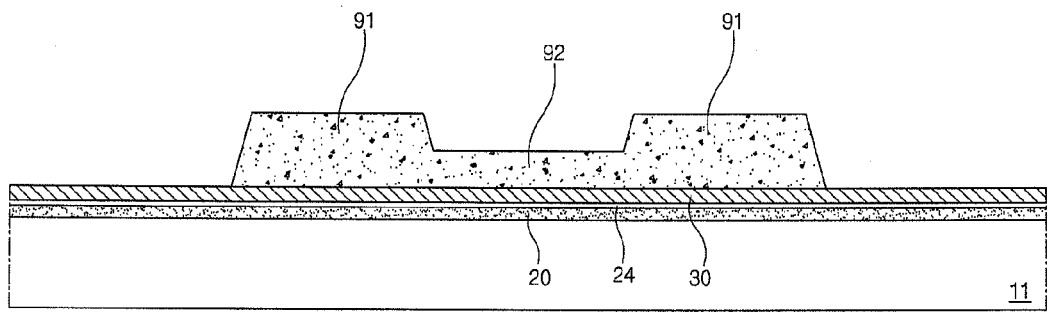
FIGS. 2A to 2E are cross-sectional views illustrating forming the thin film transistor of FIG. 1.
Figure 2B:
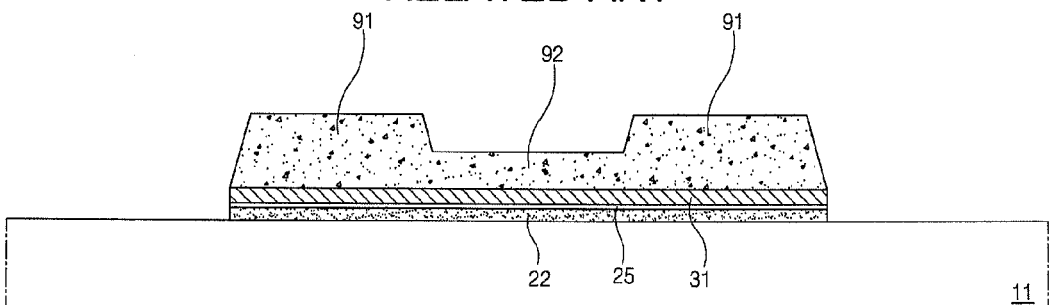
Figure 2C:
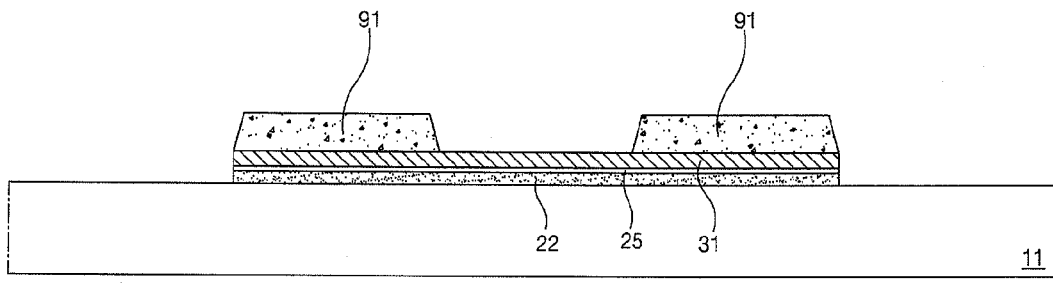
Figure 2D:
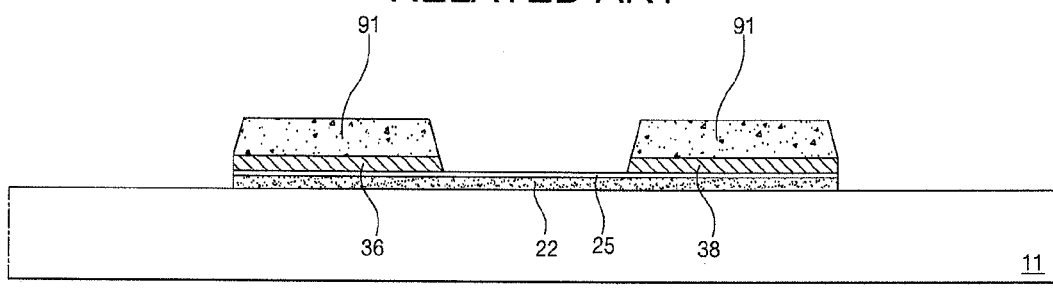
Figure 2E:
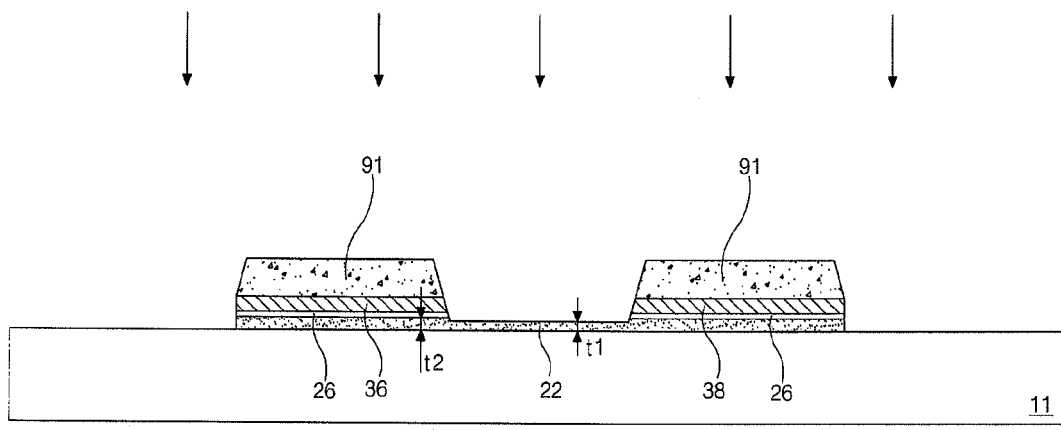
Figure 3:
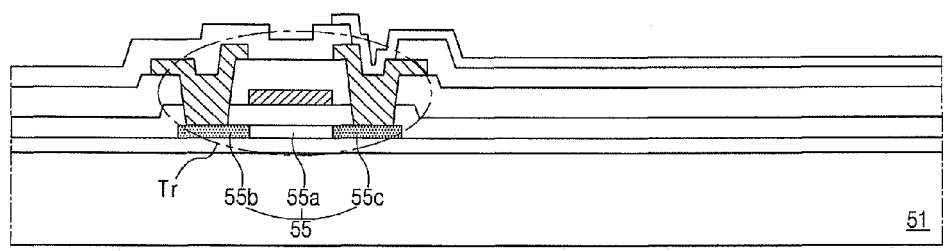
FIG. 3 is a cross-sectional view illustrating an array substrate, including a polycrystalline silicon type thin film transistor, for a display device according to the related art.

The intrinsic amorphous silicon layer 110 may have a thickness of about 400 Å to about 600 Å. In the related art, the intrinsic amorphous silicon should have a thickness of about 800 Å to about 1000 Å in consideration of partially removing a portion of the active layer between the source and drain electrodes, as shown in FIG. 2E. However, in the embodiment of the present invention, since the intrinsic amorphous silicon layer 110 is not partially etched as described below, the intrinsic amorphous silicon layer 110 can be formed with the thickness less than the related art. Accordingly, production costs and time can be reduced.

Figure 4B:
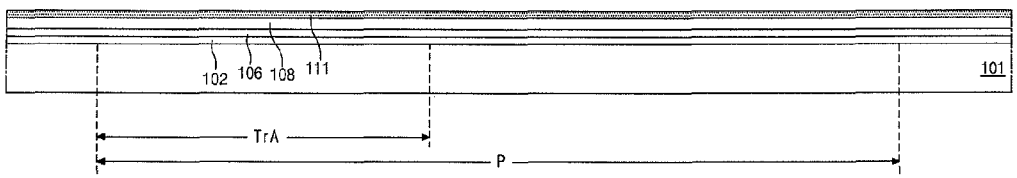

Referring to FIG. 4B, a crystallization process for the intrinsic amorphous silicon layer 110 is performed. For example, a SPC (Solid Phase Crystallization) is employed. Accordingly, the intrinsic amorphous silicon layer (110 of FIG. 4A) is crystallized and changed into an intrinsic polycrystalline silicon layer 111. Further, during the SPC, the extrinsic amorphous silicon layer (105 of FIG. 4A) is crystallized and changed into an extrinsic polycrystalline silicon layer 106. The SPC may be a crystallization using a thermal treatment. Alternatively, the SPC may be an alternating magnetic field crystallization (AMFC).

Figure 4C:
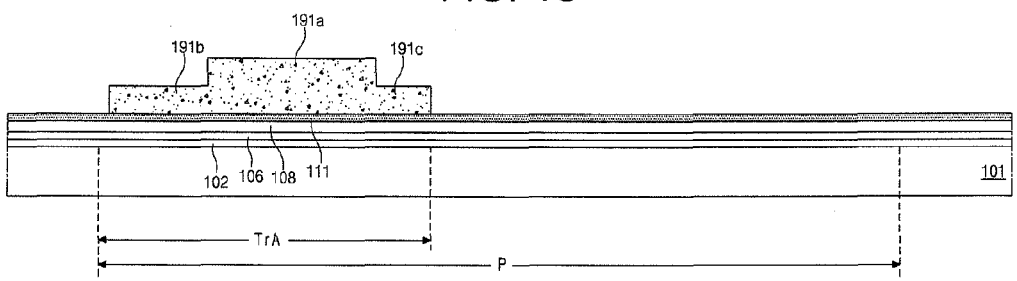

Referring to FIG. 4C, a photoresist layer is formed on the intrinsic polycrystalline silicon layer 111. Then, a mask is located over the photoresist layer. The mask includes a transmission portion, a blocking portion and a semi-transmission portion. The transmission portion passes light, the blocking portion blocks light, and the semi-transmission portion passes light to a predetermined extent. In other words, a transmissivity of the semi-transmission portion is between a transmissivity of the transmission portion and a transmissivity of the blocking portion. The semi-transmission portion may be configured using a plurality of slits or a multi-layered film.

Assuming that the photoresist layer is a p-type, the blocking portion corresponds to a first region of the switching region TrA, and the semi-transmission portions corresponds to second and third regions at both sides of the first region of the switching region TrA. Then, a light exposure and a developing process are performed for the photoresist layer. Accordingly, a photoresist pattern is formed. The photoresist pattern includes first to third portions 191a to 191c. The second and third portions 191b and 191c are formed at both sides of the first portion 191a. In other words, the second and third portions 191b and 191c correspond to the semi-transmission portions of the mask, and the first portion 191a corresponds to the blocking portion. Accordingly, the second and third portions 191b and 191c have a thickness less than a thickness of the first portion 191a. The second portion 191b may have a width more than a width of the third portion 191c.

Figure 4D:
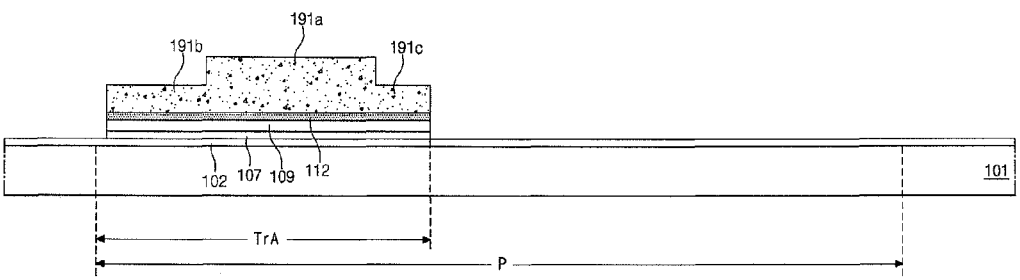

Referring to FIG. 4D, the intrinsic polycrystalline silicon layer (111 of FIG. 4C), the first insulating layer (108 of FIG. 4C) and the extrinsic polycrystalline silicon layer (106 of FIG. 4C) are patterned using the photoresist pattern. Accordingly, a gate electrode 107 made of the extrinsic polycrystalline silicon, a gate insulating layer 109 made of the inorganic insulating material, and an intrinsic polycrystalline silicon pattern 112 are formed in the switching region TrA. The gate electrode 107, the gate insulating layer 109, and the intrinsic polycrystalline silicon pattern 112 have an island shape.

If the gate electrode 107 is made of a metallic material, this causes a problem. It is assumed that, in FIG. 4B, the extrinsic amorphous silicon is replaced with the metallic material. The SPC is performed at a high temperature, at least about 600 degrees in Celsius. When the SPC is performed to form the intrinsic polycrystalline silicon, the metallic material is deformed, or penetrates through the first insulating layer (108 of FIG. 4B) and contacts the intrinsic polycrystalline silicon, which is referred to as a spiking phenomenon. As such, if the metallic material is used for the gate electrode 107, the problem as above is caused. To prevent this problem, the silicon is used for the gate electrode 107. The extrinsic amorphous silicon has a conductivity less than that of the metallic material. However, in the embodiment, the extrinsic amorphous silicon is crystallized during the SPC. When the gate electrode 107 made of the extrinsic polycrystalline silicon has a thickness of about 500 Å to about 1000 Å, a surface resistance of the gate electrode 107 is about 150 Ω/sq to about 230 Ω/sq. This surface resistance is close to a surface resistance of a transparent conductive material, for example, indium-tin-oxide (ITO) or indium-zinc-oxide (IZO). Accordingly, the extrinsic polycrystalline silicon can appropriately function as the gate electrode 106.

Figure 4E:
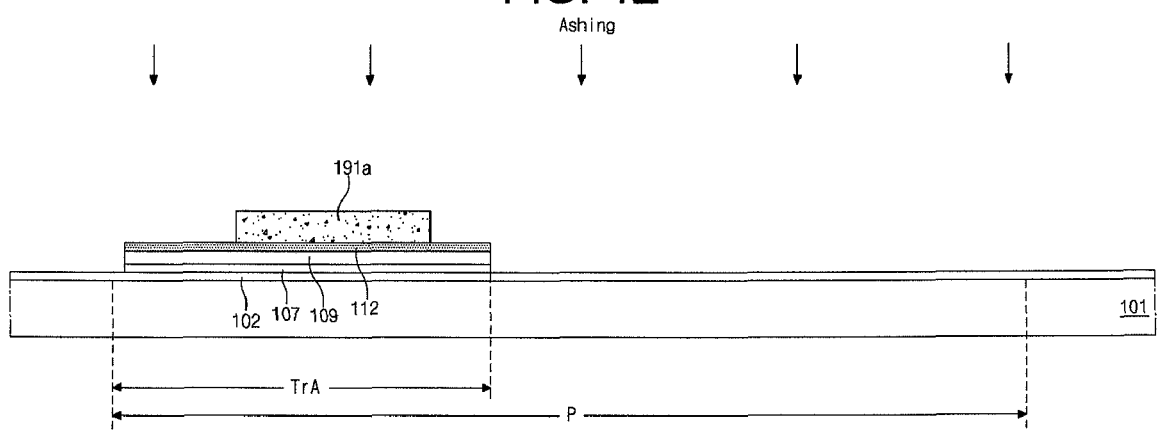

Referring to FIG. 4E, an ashing process is performed for the photoresist pattern to remove the second and third portions (191b and 191c of FIG. 4D). Accordingly, portions of the intrinsic polycrystalline silicon pattern 112 below the second and third portions are exposed. During the ashing process, the first portion 191 is partially removed.

Figure 4F:
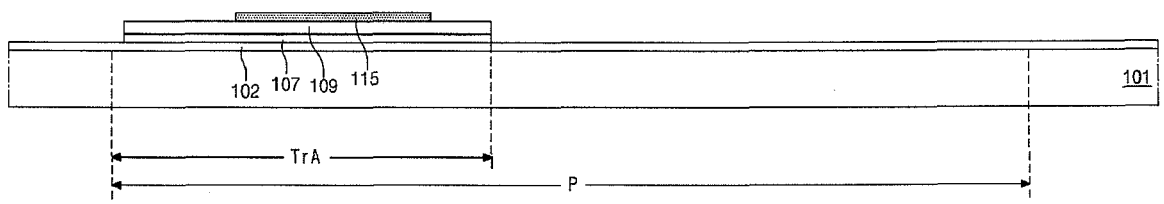

Referring to FIG. 4F, the intrinsic polycrystalline silicon pattern (112 of FIG. 4E) is patterned using the ashed photoresist pattern to form an active layer 115. Then, the ashed photoresist pattern is removed by a stripping process.

Figure 4G:
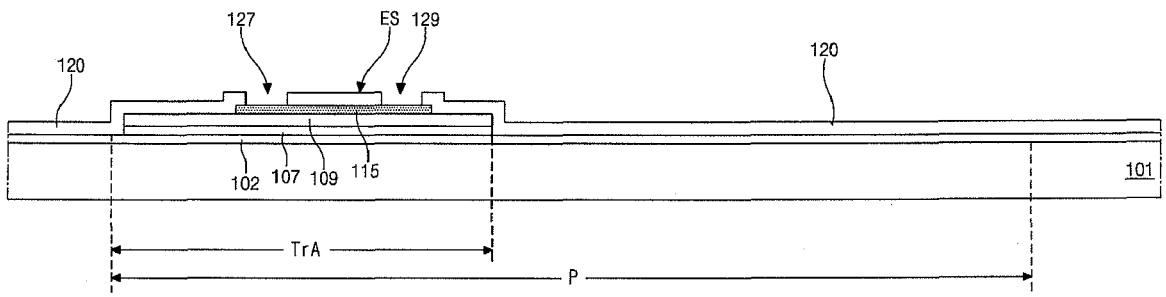

Referring to FIG. 4G, a second insulating layer 120 are formed on the substrate 101 having the active layer 115. For example, at least one of a silicon oxide ($SiO_2$) layer and a silicon nitride (SiNx) layer are formed as the second insulating layer 120. It is preferred that the second insulating layer 120 includes the silicon oxide layer as a first layer and the silicon nitride layer as a second layer on the first layer. The silicon oxide layer may have a thickness of about 50 Å to about 500 Å, and the silicon nitride layer may have a thickness of about 50 Å to about 500 Å. The silicon oxide has a property of adhesion to a polycrystalline silicon better than the silicon nitride, and the silicon nitride has a property of adhesion to an amorphous silicon better than the silicon oxide. Accordingly, the silicon oxide is used for the first layer, and the silicon nitride is used for the second layer. For similar reason, it is preferred that the buffer layer 102 and the gate insulating layer 109 are made of silicon oxide ($SiO_2$).

Then, a photoresist pattern is formed on the second insulating layer 120. The second insulating layer 120 is patterned using the photoresist pattern to form first and second holes 127 and 129 exposing both side portions of the active layer 115. A portion of the second insulating layer 120 between the first and second holes 127 and 129 is referred to as an etch stopper ES. Alternatively, in the pixel region P, the etch stopper ES is formed, and a portion of the second insulating layer 120 other than the etch stopper ES may be removed in the patterning process.

Figure 4H:
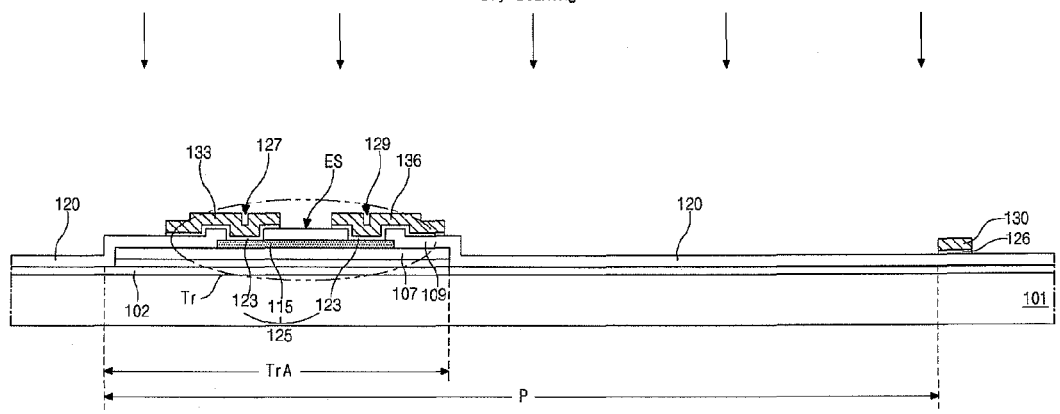

Referring to FIG. 4H, an extrinsic amorphous silicon layer is formed on the second insulating layer 120. Then, a conductive layer, for example, a first metal layer is formed on the extrinsic amorphous silicon layer. The first metal layer may be made of at least one of molybdenum (Mo), chromium (Cr) and molybdenum-titanium (MoTi). A barrier layer may be formed before the extrinsic amorphous silicon layer. The barrier layer is made of intrinsic amorphous silicon. The barrier layer is between the active layer 122 and the extrinsic amorphous silicon layer to improve adhesion therebetween. The barrier layer may have a thickness of about 10 Å to about 50 Å.

The first metal layer is patterned to form a data line 130, and source and drain electrodes 133 and 136. The source and drain electrodes 133 and 136 overlap the etch stopper ES and are spaced apart from each other on the etch stopper ES. The source electrode 133 extends from the data line 130. The source and drain electrodes 133 and 136 may be in an outline of the gate electrode 108.

Then, the extrinsic amorphous silicon layer is patterned, for example, in a dry-etching process, to form both ohmic contact layers 123 and a semiconductor pattern 126 made of the extrinsic amorphous silicon. The both ohmic contact layers 123 contacts the both side portions of the active layer 115 through the first and second holes 127 and 129, respectively. The semiconductor pattern 126 extends along below the data line 130. The ohmic contact layers 123 have substantially the same shape in plane as the source and drain electrodes 133 and 136, and the semiconductor pattern 126 has substantially the same shape in plane as the data line 130. The ohmic contact layers 123 and the active layer 115 forms a semiconductor layer 125. The gate electrode 107, the semiconductor layer 125 and the source and drain electrodes forms a thin film transistor Tr. When the barrier layer is used, the barrier layer is patterned in the same shape as the ohmic contact layers 123 and the semiconductor pattern 126. Accordingly, the patterned barrier layer is located below the ohmic contact layers 123 and the semiconductor pattern 126.

Since the etch stopper ES is on the active layer 115, the active layer 115 is prevented from being etched in the dry-etching process of the extrinsic amorphous silicon layer. Accordingly, the active layer 115 is not damaged by the dry-etching process and has substantially the same thickness all over the active layer 115. Accordingly, a property of the thin film transistor Tr is improved and reliable.

When the array substrate is used for an OELD device, a power line may be formed in the same process of forming the data line 130 and the source and drain electrodes 133 and 136. Further, through the above-described processes, in the array substrate of the OELD device, a driving thin film transistor is further formed in the pixel region P. In other words, in the array substrate of the OELD, the driving thin film transistor has a structure similar to the switching thin film transistor Tr of FIG. 4H.

Figure 4I:
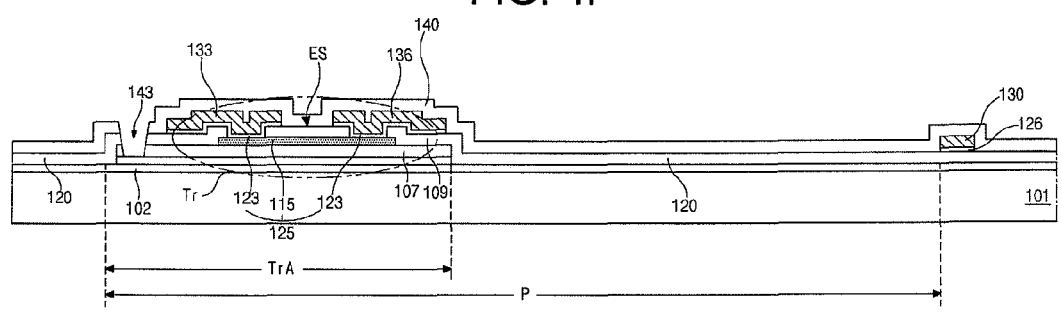

Referring to FIG. 4I, a first passivation layer 140 is formed on the substrate 101 having the source and drain electrodes 133 and 136. The first passivation layer 140 may be made of an inorganic insulating material, for example, silicon oxide ($SiO_2$) and silicon nitride (SiNx). The first passivation layer 140, the second insulating layer 120 and the gate insulating layer 109 are patterned to form a gate contact hole 143.

Figure 4J:
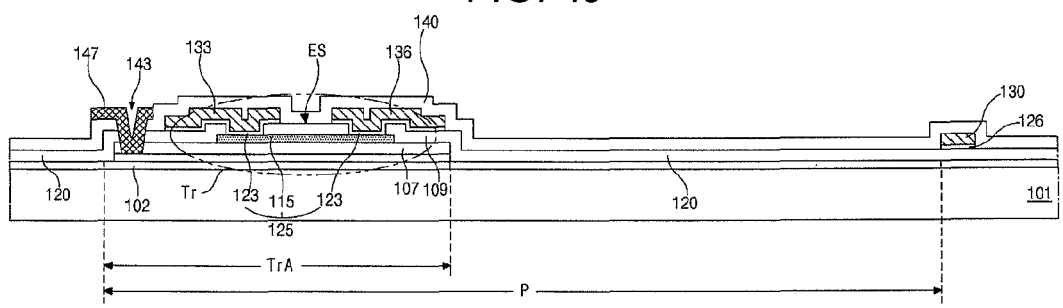

Referring to FIG. 4J, a second conductive layer, for example, a second metal layer is formed on the first passivation layer 140 and patterned to form a gate line 147. The gate line 147 contacts the gate electrode 107 through the gate contact hole 143. The gate line 147 may be made of at least one of aluminum (Al), aluminum alloy (AlNd), copper (Cu), copper alloy, molybdenum (Mo), molybdenum-titanium (MoTi) and chromium (Cr) and have a single or multiple-layered structure using the materials. For example, when the gate line 147 has a double-layered structure, aluminum alloy (AlNd)/molybdenum (Mo) structure may be used. The gate line 147 crosses the data line 130 to define the pixel region P.

Figure 4K:
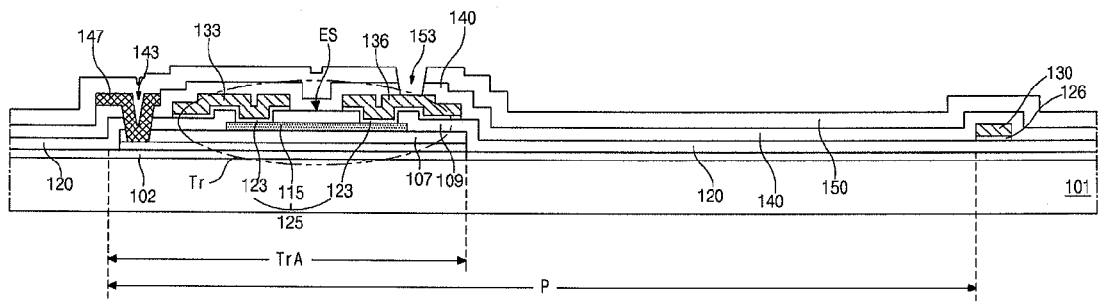

Referring to FIG. 4K, a second passivation layer 150 is formed on the substrate 101 having the gate line 147. The second passivation layer 150 may be made of an inorganic insulating material, for example, silicon oxide ($SiO_2$) and silicon nitride (SiNx), or an organic insulating material, for example, benzocyclobutene (BCB) and photo acrylic. The first and second passivation layers 140 and 150 are patterned to form a drain contact hole 153 exposing the drain electrode 136.

Figure 4L:
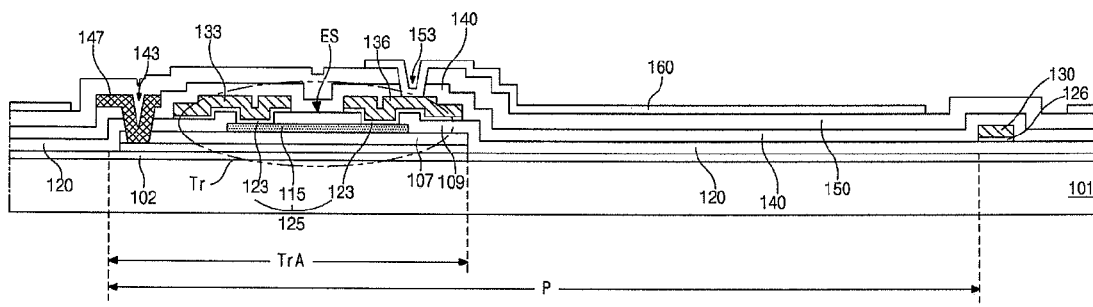

Referring to FIG. 4L, a transparent conductive material is formed on the second passivation layer 150 and patterned to form a pixel electrode 160. The transparent conductive material may be one of indium-tin-oxide (ITO), indium-zinc-oxide (IZO), and indium-tin-zinc-oxide (ITZO). The pixel electrode 160 contacts the drain electrode 136 through the drain contact hole 153.

In crystallizing the intrinsic amorphous silicon with the thermal treatment, a silicon oxide film may be formed on a surface of the intrinsic polycrystalline silicon. To remove the silicon oxide film, the intrinsic polycrystalline silicon may be rinsed using 20:1 BOE (buffered oxide etchant) which is a BOE diluted with a DI (deionized) water with a ratio of BOE:DI water, 20:1. The rinsing process may be performed after forming the active layer and before depositing the second insulating layer. Alternatively, the silicon oxide film may be removed when forming the first and second holes in the second insulating layer. For example, in case that the first layer of the second insulating layer is made of silicon oxide, the silicon oxide film may be removed in patterning the first layer to form the first and second contact holes by an etchant for the first layer.

When the array substrate as described above is used for an LCD device, the array substrate is attached to an opposing substrate, and a liquid crystal layer is between the array substrate and the opposing substrate. The opposing substrate may include a common electrode facing the pixel electrode 160 to induce an electric field.

When the array substrate as described above is used for the OELD device, the thin film transistor Tr functions as the switching thin film transistor, and the driving thin film transistor is connected to the switching thin film transistor Tr. The switching thin film transistor Tr is not connected to the pixel electrode 160 while a drain electrode of the driving thin film transistor is connected to the pixel electrode 160. The drain electrode of the switching thin film transistor Tr is connected to a gate electrode of the driving thin film transistor. The pixel electrode 160 connected to the driving thin film transistor may be one of an anode and a cathode of an organic light emitting diode of the OELD device. Alternatively, the organic light emitting diode may be included in an opposing substrate, the opposing substrate may be attached to the array substrate including the switching thin film transistor Tr and the driving thin film transistor, and the driving thin film transistor may be electrically connected to the organic light emitting diode, for example, through a connection pattern which passes through a cell gap between the opposing substrate and the array substrate.

It should be understood that the array substrate in the embodiment can be employed into various electronic devices using the thin film transistor.

Figure 1:
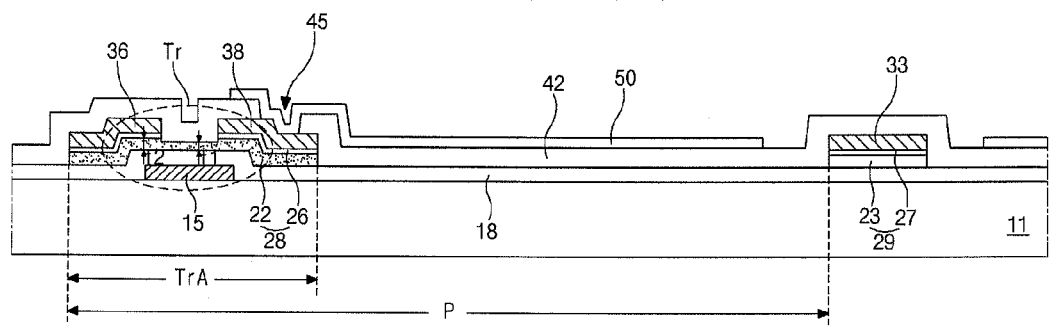
FIG. 1 is a cross-sectional view illustrating an array substrate for a display device according to the related art.
Figure 5:
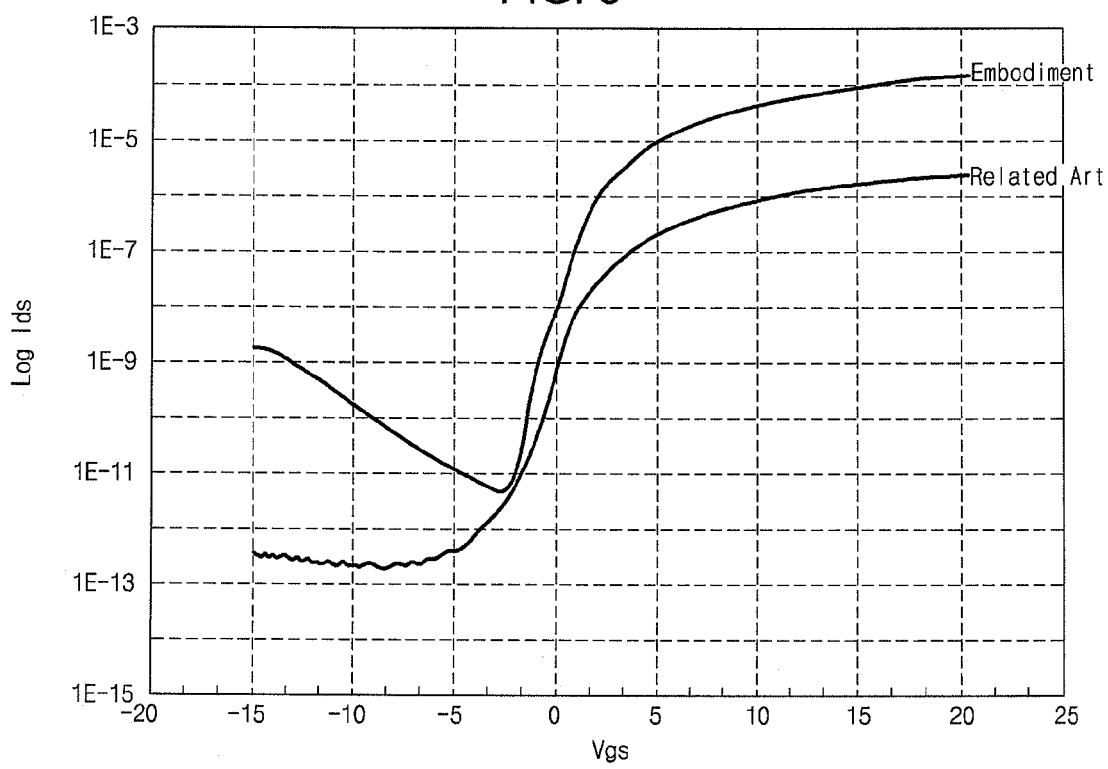
FIG. 5 shows I-V curves of the thin film transistor of the embodiment and a thin film transistor of the related art.

FIG. 5 shows I-V curves of the thin film transistor of the embodiment and a thin film transistor of the related art. In FIG. 5, the related art thin film transistor uses an active layer made of amorphous silicon, as shown in FIG. 1.

In experiment, the thin film transistor of the embodiment has a W/L ratio (a ratio of width to length of the channel), 10/7 and a source-drain voltage Vds (a voltage between the source and drain electrodes), 10V. The related art thin film transistor has a W/L ratio, 18/4, and a source-drain voltage Vds, 14V. In these conditions, referring to FIG. 5, a current Ids of the thin film transistor of the embodiment is more than a current Ids of the related art thin film transistor. In other words, a mobility of the thin film transistor of the embodiment is more than that of the relater art thin film transistor. Accordingly, the thin film transistor of the embodiment has a performance better than the related art thin film transistor.

As described above, the thin film transistor of the embodiment has a uniform thickness and is prevented from being damaged. Further, the active layer of the thin film transistor is made of polycrystalline silicon. Accordingly, the thin film transistor has a remarkable property. In addition, the extrinsic silicon of the thin film transistor can be formed without n+ or p+ ion implantation. Accordingly, production costs and processes can be reduced.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A method of manufacturing a display device, comprising:

forming a gate electrode on a substrate, a gate insulating layer on the gate electrode, and an active layer on the gate insulating layer, the gate electrode made of extrinsic polycrystalline silicon, the active layer made of intrinsic polycrystalline silicon, wherein forming the gate electrode, the gate insulating layer and the active layer includes:

forming an extrinsic amorphous silicon layer on the substrate, an insulating layer on the extrinsic amorphous silicon layer, and an intrinsic amorphous silicon layer on the insulating layer;

crystallizing the extrinsic amorphous silicon layer and the intrinsic amorphous silicon layer using a SPC (Solid Phase Crystallization);

forming a photoresist pattern including first to third portions, wherein the second and third portions are at both sides of the first portion and have a thickness less than a thickness of the first portion;

patterning the crystallized intrinsic silicon layer, the insulating layer, and the crystallized extrinsic silicon layer using the photoresist pattern, wherein the patterned crystallized extrinsic silicon layer is the gate electrode and the patterned insulating layer is the gate insulating layer;

ashing the photoresist pattern to remove the second and third portions; and pattering the patterned crystallized intrinsic silicon layer using the ashed photoresist pattern to form the active layer;

forming an etch stopper on the active layer;

forming source and drain electrodes spaced apart from each other on the etch stopper;

forming an ohmic contact layer each between a side of the active layer and the source electrode and between an opposing side of the active layer and the drain electrode;

forming a gate line connected to the gate electrode; and forming a data line crossing the gate line.

2. The method according to claim 1, wherein forming the etch stopper includes:

forming an insulating layer on the active layer; and patterning the insulating layer to form first and second holes exposing the side and the opposing side of the active layer, respectively, wherein the etch stopper is a portion of the patterned insulating layer between the first and second holes.

3. The method according to claim 2, wherein the insulating layer includes a first layer and a second layer on the first layer, and wherein the first and second layers are made of silicon oxide and silicon nitride, respectively.

4. The method according to claim 2, further comprising forming a first passivation layer on the source and drain electrodes, and patterning the first passivation layer, the insulating layer and the gate insulating layer to form a gate contact hole, wherein the gate line contacts the gate electrode through the gate contact hole.

5. The method according to claim 4, further comprising forming a second passivation layer on the first passivation layer, patterning the first and second passivation layers to form a drain contact hole, and forming a pixel electrode contacting the drain electrode through the drain contact hole.

6. The method according to claim 1, wherein the ohmic contact layer is made of extrinsic amorphous silicon.

7. The method according to claim 6, further comprising forming a barrier layer between the ohmic contact layer and each of the side and the opposing side of the active layer, having a thickness of about 10 Å to about 50 Å, and made of intrinsic amorphous silicon.

8. The method according to claim 1, wherein the gate electrode has a thickness of about 500 Å to about 1000 Å, and the active layer has a thickness of about 400 Å to about 600 Å.

9. The method according to claim 1, further comprising forming a buffer layer between the gate electrode and the substrate, wherein at least one of the buffer layer and the gate insulating layer is made of silicon oxide.

10. The method according to claim 1, wherein the display device is a liquid crystal display device or an organic electroluminescent display device.

11. A method of manufacturing an electronic device including a semiconductor, comprising:

forming a gate electrode on a substrate, a gate insulating layer on the gate electrode, and an active layer on the gate insulating layer, the gate electrode made of extrinsic polycrystalline silicon, the active layer made of intrinsic polycrystalline silicon, wherein forming the gate electrode, the gate insulating layer and the active layer includes:

forming an extrinsic amorphous silicon layer on the substrate, an insulating layer on the extrinsic amorphous silicon layer, and an intrinsic amorphous silicon layer on the insulating layer;

crystallizing the extrinsic amorphous silicon layer and the intrinsic amorphous silicon, layer using a SPC (Solid Phase Crystallization);

forming a photoresist pattern including first to third portions, wherein the second and third portions are at both sides of the first portion and have a thickness less than a thickness of the first portion;

patterning the crystallized intrinsic silicon layer, the insulating layer, and the crystallized extrinsic silicon layer using the photoresist pattern, wherein the patterned crystallized extrinsic silicon layer is the gate electrode and the patterned insulating layer is the gate insulating layer;

aching the photoresist pattern to remove the second and third portions; and pattering the patterned crystallized intrinsic silicon layer using the ashed photoresist pattern to form the active layer;

forming an etch stopper on the active layer;

forming source and drain electrodes spaced apart from each other on the etch stopper; and forming an ohmic contact layer each between a side of the active layer and the source electrode and between an opposing side of the active layer and the drain electrode.

12. The method according to claim 11, wherein forming the etch stopper includes:

forming an insulating layer on the active layer; and patterning the insulating layer to form first and second holes exposing the side and the opposing side of the active layer, respectively, wherein the etch stopper is a portion of the patterned insulating layer between the first and second holes.

13. The method according to claim 11, wherein the ohmic contact layer is made of extrinsic amorphous silicon.

* * * * *

UNITED STATES PATENT AND TRADEMARK OFFICE
CERTIFICATE OF CORRECTION

| | |
|---|---|
| PATENT NO. | : 8,030,106 B2 |
| APPLICATION NO. | : 12/497101 |
| DATED | : October 4, 2011 |
| INVENTOR(S) | : Hee-Dong Choi et al. |

It is certified that error appears in the above-identified patent and that said Letters Patent is hereby corrected as shown below:

In the Claims

In column 10, claim 11, line 42, before "the photoresist pattern to remove" replace "aching" with --ashing--.

Signed and Sealed this
Third Day of January, 2012

David J. Kappos
*Director of the United States Patent and Trademark Office*